(12) United States Patent
Shoda et al.

(10) Patent No.: US 7,872,413 B2
(45) Date of Patent: Jan. 18, 2011

(54) ORGANIC LIGHT EMITTING DISPLAY DEVICE PROVIDED WITH AN ORGANIC LAYER INCLUDING AN AMORPHOUS MOLYBDENUM OXIDE LAYER AND A CRYSTAL MOLYBDENUM OXIDE LAYER

(75) Inventors: Ryo Shoda, Tokyo (JP); Eiichi Kitazume, Tokyo (JP); Shingo Kaneta, Tokyo (JP)

(73) Assignee: Toppan Printing Co., Ltd. (JP)

( * ) Notice: Subject to any disclaimer, the term of this patent is extended or adjusted under 35 U.S.C. 154(b) by 143 days.

(21) Appl. No.: 12/411,302

(22) Filed: Mar. 25, 2009

(65) Prior Publication Data
US 2009/0243478 A1   Oct. 1, 2009

(30) Foreign Application Priority Data
Mar. 26, 2008   (JP)   ............... 2008-081351

(51) Int. Cl.
*H01L 51/50* (2006.01)
*H01L 51/54* (2006.01)
*H01L 51/56* (2006.01)

(52) U.S. Cl. .................. 313/504; 313/503; 313/506; 445/24; 427/66

(58) Field of Classification Search ......... 313/500–512; 428/690; 445/24–25; 427/66
See application file for complete search history.

(56) References Cited

U.S. PATENT DOCUMENTS

2006/0119258 A1*   6/2006   Sakata et al. ................ 313/504
2007/0241665 A1*   10/2007   Sakanoue et al. ........... 313/503

FOREIGN PATENT DOCUMENTS

| JP | 11-307259 | 11/1999 |
| JP | 2000-100572 | 4/2000 |
| JP | 2002-367784 | 12/2002 |

* cited by examiner

*Primary Examiner*—Mariceli Santiago
(74) *Attorney, Agent, or Firm*—Squire, Sanders & Dempsey L.L.P.

(57) ABSTRACT

One embodiment of the present invention is an organic electroluminescence element including an anode which is a hole injection electrode; a cathode which is an electron injection electrode, the cathode facing the anode; an organic light emitting layer between the anode and the cathode, the organic light emitting layer including a molybdenum oxide layer, the molybdenum oxide layer including a crystal molybdenum oxide and an amorphous molybdenum oxide, and the crystal molybdenum oxide and the amorphous molybdenum oxide being mixed or stacked.

16 Claims, 5 Drawing Sheets

ORGANIC LIGHT EMITTING DISPLAY DEVICE PROVIDED WITH AN ORGANIC LAYER INCLUDING AN AMORPHOUS MOLYBDENUM OXIDE LAYER AND A CRYSTAL MOLYBDENUM OXIDE LAYER

CROSS REFERENCE

This application is based upon and claims the benefit of priority from the prior Japanese Patent Application No. 2008-081351, filed on Mar. 26, 2008, the entire contents of which are incorporated herein by reference.

BACKGROUND OF THE INVENTION

1. Field of the Invention

The present invention is related to an organic electroluminescence element, a method for manufacturing the element and an organic electroluminescence display device. In particular, the present invention is related to an organic electroluminescence element, a method for manufacturing the element and an organic electroluminescence display device, in which the element and the display utilize electroluminescence (EL) phenomenon of an organic thin film.

2. Description of the Related Art

An organic EL element has an organic light emitting layer presenting an electroluminescent phenomenon between an anode and a cathode. When a voltage is applied between the electrodes, a hole and electrons are injected into an organic light emitting layer. Then, the hole and electrons recombine in the organic light emitting layer and the organic light emitting layer emits light. In other words, an organic electroluminescent element is a self-luminous element.

For the purpose of increasing light emitting efficiency, a hole injection layer, a hole transport layer and an electron blocking (an interlayer layer) are appropriately selected and arranged between an anode and an organic light emitting layer, and, a hole blocking layer, an electron transport layer and an electron injection layer are appropriately selected and arranged between an organic light emitting layer and a cathode. Here, an organic light emitting layer as well as a hole injection layer, a hole transport layer, an electron blocking layer (an interlayer layer), a hole blocking layer, an electron transport layer, an electron injection layer are called a light emitting medium layer.

A low molecular type material or a high molecular type material, both including mainly an organic material, and an inorganic material are used for the respective layers of the light emitting medium layer.

Examples of low molecular materials are described below. Copper phthalocyanine (CuPc) is used as a hole injection layer. N,N'-diphenyl-N,N'-bis(3-methylphenyl)-1,1'-biphenyl-4,4'-diamine (TPD) is used as a hole transport layer. Tris (8-quinolinol) aluminium (Alq3) is used as an organic light emitting layer. 2-(4-biphenylyl)-5-(4-tert-butyl-phenyl)-1,3,4,-oxadiazole (PBD) is used as an electron transport layer. Lithium fluoride (LiF) is used as an electron injection layer.

Generally, the thickness of each layer of the organic light emitting medium layer including a low molecular material is from 0.1 to 200 nm. These layers are formed by a dry process in a vacuum condition such as a vacuum evaporation method such as a resistance heating method or a sputter method.

In addition, there are various kinds of low molecular materials. An improvement of luminous efficiency, emission brightness, life time or the like by combining the various materials is expected.

On the other hand, for example, for polymeric materials, the following materials for an organic light emitting layer can be used: The material which low-molecular luminescent coloring matter dissolves in polymers such as polystyrene, polymethyl methacrylate and polyvinyl carbazole; Macromolecular fluorescent substance such as polyphenylene vinylene derivative (PPV) or poly alkylfluorene derivative (PAF); and Polymer phosphor such as a rare earth metal system.

Generally a coating liquid (an ink) is made by dissolving or dispersing these polymeric materials in a solvent. Further, using a wet process such as application or printing, a layer of which thickness is about 1-100 nm is formed.

In comparison with a dry process in a vacuum condition such as a vacuum evaporation method, a wet process has the following merits: Film formation under atmospheric air is possible; facilities are inexpensive; upsizing is easy; and a layer can be formed efficiently in a short time.

In addition, an organic thin film layered using a polymeric (high molecular) material has the following merits: Crystallization and cohesion are hard to occur; and a pinhole and a foreign matter of the other layer can be coated. Therefore, an organic thin film made of a polymeric material can prevent defects such as a short-circuit or a dark spot.

Examples of inorganic materials include alkali metals such as Li, Na, K, Rb, Ce and Fr, alkaline-earth metals such as Mg, Ca, Sr and Ba, lanthanoids such as La, Ce, Sm, Eu, Gd and Yb, metallic elements such as Au, Cu, Al, Fe, Ni, Ru, Sn, Pb, Cr, Ir, Nb, Pt, W, Mo, Ta, Pa and Co, Si, Ge, and oxide, carbide, nitride, and boride thereof.

There are a lot of kinds of materials of a high adhesiveness and a high stability to heat among an inorganic material, compared with organic materials. Therefore, if an inorganic material is used, it is expected that occurrence of non-light emitting area called dark spots is reduced, and that light emitting characteristic and life time are improved. In addition, an inorganic material is relatively inexpensive compared with an organic material. If application to a large-sized display or high-volume production is considered, an inorganic material plays an important role in cost reduction.

Patent document 1 discloses a structure in which an inorganic hole injection layer using an inorganic material is formed between an organic light emitting layer and an anode which is an hole injection electrode. The structure utilizes the above feature of an inorganic material.

In addition, patent document 2 and patent document 3 disclose a structure. In the structure, an inorganic oxide electron injection layer is formed between an organic light emitting layer and an anode which is an electron injection electrode.

It is known that molybdenum oxide is especially useful from the following reasons: film formation is easy; and a hole injection function or a hole transport function from a hole injection electrode is relatively high compared with other inorganic materials.

In general, a hole injection transport function is determined by the number of carrier, the mobility of carrier or both of them. Resistivity and a hole injection function depends on IP (ionization potential) etc. An inorganic material as molybdenum oxide has usually a high resistivety. There is a difference in IP between an inorganic material (molybdenum oxide) and an anode. A hole injection function and a hole transport function of an inorganic material (molybdenum oxide is insufficiently yet. Current is difficult to flow. A sufficient light emitting luminance can not be obtained. In addition, holes sufficient for electrons are not injected to a light emitting layer. That is, carrier balance is lost.

The present invention includes a flat molybdenum oxide including a crystal structure. Therefore, resistivity or ionization potential is optimized. Injection property or transport property of carrier is improved. The present invention provides an organic electroluminescence element, a method for manufacturing the element and an organic electroluminescence display device, in which light emitting luminance and life time are high and there was no defect.

[patent document 1] JP-A-H11-307259
[patent document 2] JP-B-3692844
[non-patent document 1] JP-B-3773423

SUMMARY OF THE INVENTION

One embodiment of the present invention is an organic electroluminescence element including an anode which is a hole injection electrode; a cathode which is an electron injection electrode, the cathode facing the anode; an organic light emitting layer between the anode and the cathode, the organic light emitting layer including a molybdenum oxide layer, the molybdenum oxide layer including a crystal molybdenum oxide and an amorphous molybdenum oxide, and the crystal molybdenum oxide and the amorphous molybdenum oxide being mixed or stacked.

In these drawings, 100 is an organic EL element; 101 is a substrate; 102 is an anode; 103 is a light emitting medium layer; 103a is a hole injection layer; 103b is an interlayer layer; 103c is an organic light emitting layer; 103d is an electron injection layer; 104 is a molybdenum oxide layer; 104a is a crystal containing layer; 104b is an amorphous layer; 105 is a cathode; 201 is a substrate to be printed; 202 is an ink tank; 203 is an ink chamber; 204 is an anilox roll; 204a is a coating layer; 205 is a plate; 206 is a plate cylinder; 207 is a flat base; 300 is an organic EL display device; 306 is a substrate; 307 is an active layer; 308 is a gate insulating film; 309 is a gate electrode; 310 is an interlayer dielectric; 311 is a drain electrode; 312 is a scanning line; 313 is a source electrode; 314 is a pixel electrode; 315 is a partition wall; 316 is a molybdenum oxide layer; 316a is a crystal containing layer; 316b is an amorphous layer; 317 is an interlayer layer; 318 is an organic light emitting layer; 319 is a counter electrode; 320 is an insulating protective layer.

DETAILED DESCRIPTION OF THE INVENTION

Hereinafter, embodiments of the present invention are described referring to figures. In addition, the figures are used for explaining constitutions of the present invention. Therefore, a size, a thickness, a dimension etc. of respective parts shown in the figures are different from factual values. In addition, the present invention is not limited to these figures.

Figure 1:
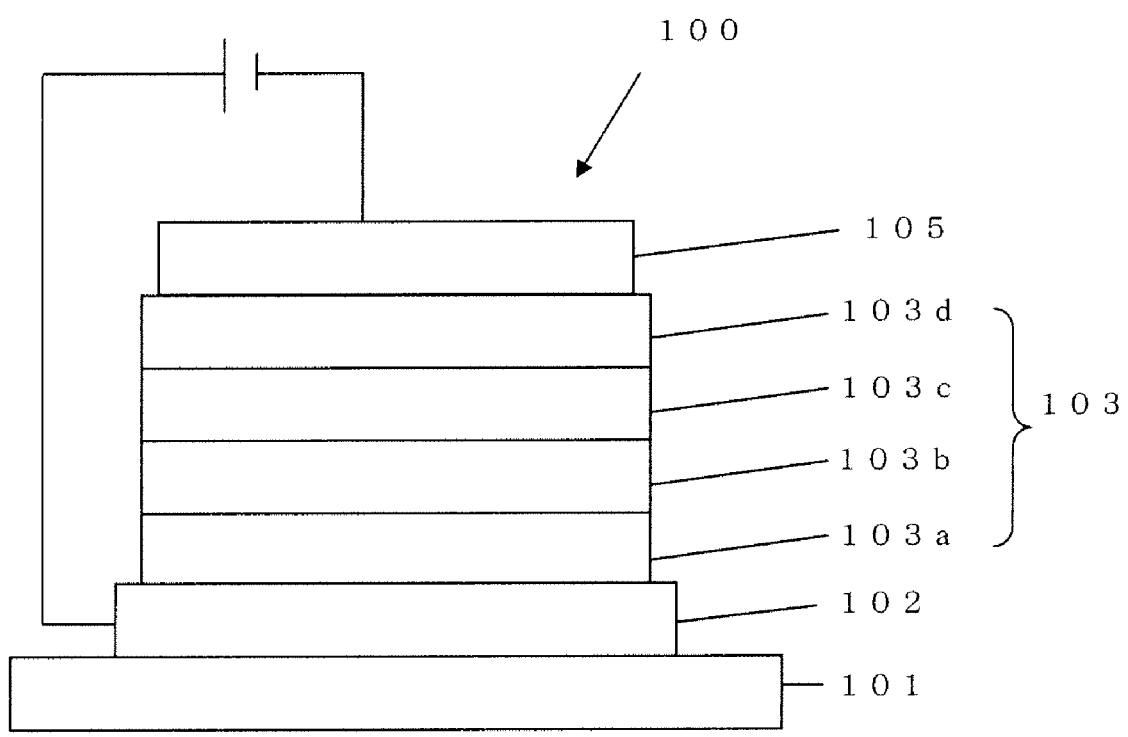
FIG. 1 is a schematic cross-sectional view showing an example of an organic EL element of an embodiment of the present invention.

As shown in FIG. 1, an organic EL element 100 of an embodiment of the present invention includes a substrate 101, an anode 102, a light emitting medium layer 103 and a cathode 105. A light emitting medium layer 103 includes a hole injection layer 103a, an interlayer layer 103b, an organic light emitting layer 103c and an electron injection layer 103d.

In the case where a substrate side is a display side, a substrate is not particularly limited as long as it is a substrate having translucency and a certain level of strength, and specifically, a glass board, or a plastic film or sheet can be used. When a thin glass board having a thickness of 0.2 to 1 mm is used, a thin organic EL display 100 having extremely high barrier properties can be produced.

As a formation material of an anode 102, a transparent or semitransparent conductive material is preferably used.

For example, complex oxide (ITO) of indium and tin, complex oxide (IZO) of indium and zinc, tin oxide, zinc oxide, indium oxide or zinc aluminium complex oxide can be used for a material of an anode 102.

ITO can be preferably used from the following reason: Electrical resistance is low; Solvent resistance is high; and transparency is high.

ITO can be layered by evaporation or a sputtering method on a substrate 101.

It is also possible to form the anode by coating a precursor such as indium octylate or acetone indium on a substrate 31 and then performing a coating pyrolysis method for forming an oxide by thermal decomposition. Alternatively, it is possible to use a metal such as aluminum, gold, silver, or the like in a translucent state provided by vapor deposition. Further, an organic semiconductor such as polyaniline may be used.

An anode 102 may be patterned by etching or subjected to surface activation by a UV treatment, a plasma treatment, or the like when so required.

A light emitting medium layer 103 has a plurality of functional layers. Examples of functional layers include a hole injection layer 103a, a hole transport layer (not illustrated), an electron blocking layer (an interlayer layer (not illustrated)), an organic light emitting layer 103c, a hole blocking layer (not illustrated), an electron transport layer (not illustrated), an electron injection layer 103d and an insulating protective layer (not illustrated).

As shown in FIG. 1, a light emitting medium layer 103 includes a hole injection layer 103a, an interlayer layer 103b, an organic light emitting layer 103c, an electron injection layer 103d. However, a layer structure of a light emitting layer 103 can be arbitrary selected.

A material which is used as a hole transport material can be preferably used for a material of a hole injection layer 103a used in an embodiment of the present invention. Examples of hole transport materials include poly aniline derivative, poly thiophenes, polyvinylcarbazole (PVK) derivative, poly (3,4-ethylenedioxy thiophene) (PEDOT) and an inorganic material.

Examples of an inorganic material are as follows:
alkali metal such as Li, Na, K, Rb, Ce and Fr;
alkaline earth metallic elements such as Mg, Ca, Sr and Ba;
lanthanoid system element such as La, Ce, Sm, Eu, Gd and Yb;
metallic elements such as Au, Cu, Al, Fe, Ni, Ru, Sn, Pb, Cr, Ir, Nb, Pt, W, Mo, Ta, Pa and Co;
Si and Ge; and
compounds such as oxide, carbides, nitride and boride of the above materials.

Examples of materials used for an interlayer layer 103b in an embodiment of the present invention include polyvinylcarbazole, derivative of polyvinylcarbazole, polyarylene derivative having aromatic amine at a main chain or a side chain, and polymers having aromatic amine such as aryl amine derivative and triphenyl diamine derivative. These materials are dissolved or dispersed in a solvent, and an interlayer layer 103b is formed by using the dissolved or dispersed material by various application methods using a spin coater etc. or a relief printing method. In addition, in the case where an inorganic material is used for a material of an interlayer layer 103b, an interlayer layer 103b can be formed by using a metal oxide by a vacuum vapor deposition method, a sputtering method or a CVD method.

Generally used organic light emitting material can be preferably used for an organic light emitting material used for an organic light emitting layer 103c in an embodiment of the present invention. Examples include well-known fluorescent low-molecular materials that can emit light from a singlet state, such as materials of a coumarin system, a perylene system, a pyran system, an anthrone system, a porphylene system, a quinacridone system, an N,N'-dialkyl-substituted quinacridone system, naphthalimide system, and an N,N'-diaryl-substituted pyrrolopyrrole system and well-known phosphorescent low-molecular materials that can emit light from a triplet state of a rare earth metal complex. These materials can be used to form an organic light-emitting layer by a dry process such as a vacuum vapor deposition.

In addition, if the above-mentioned material is dissolved or dispersed in a solvent described below in order to make an organic light emitting application liquid, a film formation by a wet process in the atmosphere can be performed. Examples of a solvent include toluene, xylene, acetone, anisole, methyl anisole, dimethylanisole, benzoic ether, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate and water. A solvent can be comprised of one or more of the above materials.

In addition, as a high molecular material of an organic light emitting layer 103c, the following materials can be used:

Coumarin system, perylene system, pyran system, anthrone system, PORUFIREN system, quinacridon system, N,N'-dialkyl permutation quinacridon system and naphthalimido system;

The material which fluorescent pigments such as N,N'-diaryl permutation pyrrolo pyrrole series is dissolved in macromolecules such as polystyrene, polymethyl methacrylate and polyvinyl carbazole.

In addition, a macromolecular fluorescene body such as a PPV system and a PAF system and macromolecule luminous bodies such as macromolecule phosphorescence luminous bodies including a rare earth metal complex can be used.

If the high molecular material is dissolved or dispersed in a solvent described below in order to make an organic light emitting application liquid, a film formation by a wet process in the atmosphere can be performed. Examples of a solvent include toluene, xylene, acetone, anisole, methyl anisole, dimethylanisole, benzoic ether, methyl benzoate, mesitylene, tetralin, amyl benzene, methyl ethyl ketone, methyl isobutyl ketone, cyclohexanone, methanol, ethanol, isopropyl alcohol, ethyl acetate, butyl acetate and water. A solvent can be comprised of one or more of the above materials.

In particular, an aromatic solvent such as toluene, xylene, anisole, methyl anisole, dimethyl anisole, ethyl benzoate, methyl benzoate, mesitylene, tetralin or amyl benzene is more preferred because it is favorable in solubility of the high molecular material, and can be easily handled.

For a material used for electron injection layer 103d, alkali metal such as lithium fluoride or lithium oxide or, salt or oxide of alkaline earth metals can be used.

Electron injection layer 103e which is a low molecular material layer can be formed by a vacuum evaporation method using these materials.

Respective layers of a light emitting medium layer 103 have an arbitrary thickness. However, a thickness of 0.1 nm-200 nm is preferable.

A cathode 105 which is a counter electrode may be made of a metal simple substance such as Mg, Al, Yb. Stability should be balanced with electron injection efficiency. Therefore an alloy system may be used. An alloy of a metal having a low work function and a stable metal can be used. In some embodiments, alloys such as MgAg, AlLi, and CuLi can be used.

A vacuum evaporation method such as a resistance heating evaporation method, and an electron beam method and a sputtering method can be used for a method for forming a cathode 105 depending on a material thereof.

An organic light emitting medium layer preferably has an organic light emitting layer 103 and other one or more functional layer(s) to obtain sufficient luminous efficiency, emission brightness and life time.

Figure 2:
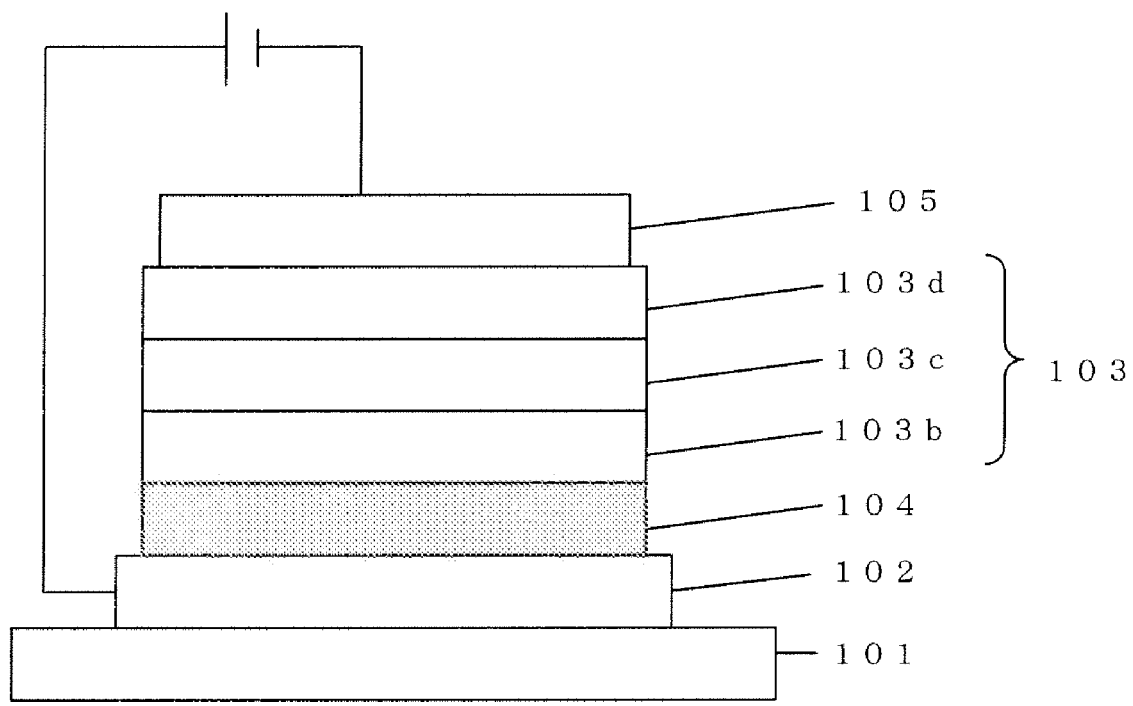
FIG. 2 is a schematic cross-sectional view showing an example of an organic EL element of an embodiment of the present invention.

As shown in FIG. 2, as for an organic EL element 100 of an embodiment of the present invention, a part of a limit emitting medium layer 103 is a molybdenum oxide layer 104 including a crystal structure. Thereby, resistivity and IP (ionization potential) are changed, and a carrier balance of an electron and a hole is optimized. Thereby, an organic EL element 100 and an organic EL display device 300 having a high light emitting efficiency, a high light emitting luminance and a long life time can be obtained.

It is known that resistivity and IP change according to crystallinity of a compound. In the case where crystallinity is low and amorphous property is high, resistivity is low and IP is high.

On the other hand, in the case where crystallinity is high and amorphous property is low, there are following features:
resistivity is low;
IP is low;
stability of a film is high; and
flatness of a film is low.

Molybdenum oxide used in an embodiment of the present invention is more preferable than other inorganic materials. This is because molybdenum oxide has a feature that film formation is easy.

It is preferable that a film thickness of a molybdenum oxide layer having a crystal structure be 30 nm-150 nm. In such a thickness, a carrier injection property is sufficiently achieved while a resistance thereof is not too high.

A molybdenum oxide layer 104 is superior in both a hole injection property and a hole transport property. Therefore, it is preferable that a molybdenum oxide layer 104 be arranged between an anode 102 and an organic light emitting layer 103c.

Figure 3:
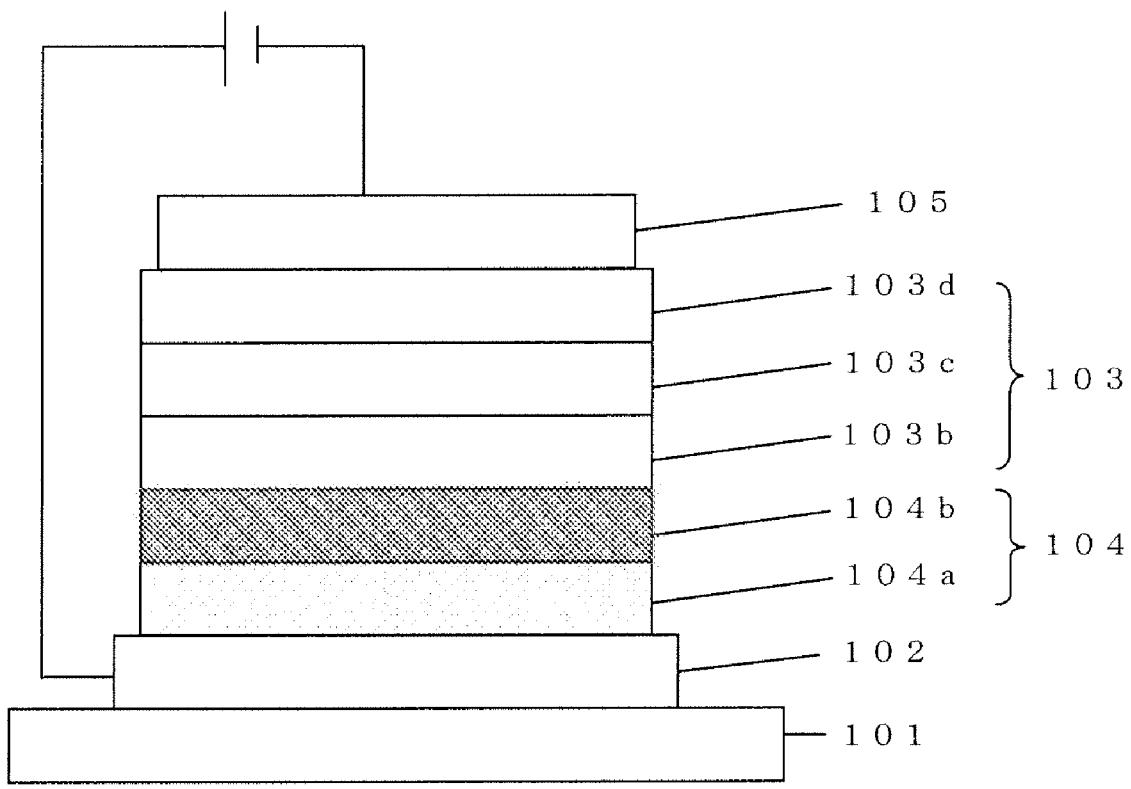
FIG. 3 is a schematic cross-sectional view showing an example of an organic EL element of an embodiment of the present invention.

As shown in FIG. 3, a molybdenum oxide layer 104 in an embodiment of the present invention is as follows:

A crystal containing layer 104a including a crystal of molybdenum oxide is formed between an anode 102 and an amorphous layer 104b which does not include a crystal of molybdenum oxide. In this case, the difference in IP between an anode 102 and molybdenum oxide is lowered. Further, injection of a hole is promoted. After a hole is injected, a hole can move more easily in a crystal containing layer 104a than in an amorphous layer 104b.

Further, the followings are reduced:

Defect of a pixel such as a pinhole or a reduction of a film flatness due to a concave/convex or a projection of a fine crystal body which appears in a film surface of high crystallinity; and Current short circuit.

Thereby, an organic EL element 100 and an organic EL display device 300 can be obtained which have a high light emitting efficiency, a high light emitting luminance and a long life time and which does not have a pinhole or a dark spot.

It is preferable that a film thickness of a crystal containing layer 104a be equal to or more than 2 nm and equal to or less than 100 nm. In such a film thickness, injection and transport is sufficient while a resistance is not too high.

It is preferable that a film thickness of an amorphous layer 104b be 5 nm-30 nm. In such a thickness, concaves/convexes or projections of a crystal containing layer 104 are sufficiently covered while a resistance thereof is not too high.

An interface between a crystal containing layer 104a and an amorphous layer 104b can be as follows: crystallinity can be gradually decreased from a crystal containing layer 104a to an amorphous layer 104b; that is, there can be a grade of crystallinity.

In FIG. 2, a molybdenum oxide layer 104 is arranged as a hole injection layer 103a. However, a molybdenum oxide layer 104 can be arranged as an arbitrary layer. Further, a plurality of molybdenum oxide layers 104 can be used as a functional layer.

A molybdenum oxide layer 104 can be formed as follows:

A vacuum evaporation of a molybdenum oxide powder is performed by a resistance heating or an electron beam;

a film is formed in the above vacuum evaporation while $O_2$ gas is further introduced; or a reactive sputtering method using both Ar gas and $O_2$ gas.

In the above respective methods, the following processes are further performed:

A film is formed while a substrate is heated (a heating film formation); or after a film is formed, heating is performed.

Thereby, a molybdenum oxide layer 104 including a crystal can be manufactured.

Especially, a heating film formation makes it possible to form a fine crystal during a film formation. Thereby, the number of processes is small. In addition, as for a heating temperature, a fine crystal can be formed at relatively low temperature compared with the method in which a film is heated after a film is formed. Therefore, a heating film formation is preferred. In addition, an amorphous molybdenum oxide layer can be manufactured by a room temperature formation without heating.

Degree or percentage of crystal changes according to a heating temperature. In the case of a heating film formation, if a temperature is equal to or more than 60 degrees Celsius, manufacturing is possible. In the case where a film is heated after a film is formed, if a temperature is equal to or more than 180 degrees Celsius, manufacturing is possible. In general, even in a fine crystal wherein the entire film is not a perfect crystal, property such as resistivity or IP has various values. The higher a heating temperature is, the higher a degree of crystallinity is.

Clear crystallinity can be confirmed by X-ray diffraction in the case of the following heating temperatures:

300 degrees Celsius or more in the case of a heating film formation; and 400 degrees Celsius or more in the case where a film is heated after a film is formed.

In addition, in the case of heating of 60-300 degrees Celsius, clear crystallinity may not be observed by X-ray diffraction. However, even in the case, improvement of conductivity because of heating is observed. It is thought that this is because a very fine crystal particle is formed in a film of molybdenum oxide. Table 1 shows comparison between a resistivety of a molybdenum oxide layer of 100 nm film thickness formed at a room temperature and that formed at 100 degrees Celsius. Table 1 shows that conductivity is significantly increased by heating.

TABLE 1

|  | a temperature of a substrate | resistivity |
|---|---|---|
| Film formation at a room temperature | 23 degrees Celsius | $8.0 \times 10^{-6} \, \Omega \cdot cm$ |
| Film formation in the case where heating is performed | 100 degrees Celsius | $1.8 \times 10^{-8} \, \Omega \cdot cm$ |

Therefore, a molybdenum oxide layer in which crystal part and amorphous part are mixed can be easily formed by the following cases:

1. a heating film formation (heating temperature is equal to or more than 60 degrees Celsius and less than 300 degrees Celsius.); and
2. after a film is formed, a film is heated (heating temperature is equal to or more than 180 degrees Celsius and less than 400 degrees Celsius.).

Degree of crystal can be controlled by temperature.

In the case where a plurality of molybdenum oxide layers are formed, it is preferable that one layer which is a crystal containing layer is formed, and an amorphous layer is formed above or under the crystal containing layer. This is because a light emitting efficiency is improved while current short circuit is controlled. In this case, it is preferable that a crystal containing layer has a high degree of crystal. Therefore, in the case where a heating film formation, heating of 300 degrees or more is preferable. In the case where heating is performed after a film is formed, heating of 400 degrees or more is preferable. The following method for forming the layers is easy: at first, a crystal containing layer 104a is formed by a heating film forming method: an amorphous layer 104b is formed thereon at a room temperature without heating.

In addition, in the case where a reactive sputtering method is used as a manufacturing method, crystallinity or film quality changes according to a temperature of a substrate. This is known as a fine model of a thin film by Thornton. Therefore, solid state properties can be changed according to a purpose. (In detail, see J. A. Thornton: J.Vac.Sci.T.,11,666(1974).)

An arbitrary amount of oxygen is used. In the case of a reactive sputtering method using a molybdenum metal target, the composition ratio can be changed by changing an oxide pressure in a total gas pressure. In the case where a concentration of oxygen is 10% or more, a molybdenum oxide layer 104 can be formed. In this case, a condition changes according to an apparatus or a total gas pressure.

In addition, it is preferable that a total gas pressure is 0.1 Pa-2.0 Pa, in view of a threshold value of ignition of plasma.

On the other hand, an amorphous layer 104a can be usually formed at a room temperature without heating a substrate. A film forming temperature of less than 60 degrees Celsius can preferably allow an excellent amorphous layer to be formed.

Using these methods, as shown FIG. 3, a molybdenum oxide layer can be formed by the following processes: for example, a crystal containing layer 104a is formed by a reactive sputtering method while a substrate is heated to 180 degrees Celsius; after a substrate is cooled to a room temperature, an amorphous layer 104b is formed thereon.

A composition ratio of oxygen to molybdenum can be confirmed by a composition analysis such as X-ray Photoelectron Spectroscopy (XPS). Crystallization can be confirmed by X-ray diffraction (XRD).

In FIG. 2 and FIG. 3, an electrode as an anode 102 is formed on a substrate 101. (At first, an anode 102 is formed.) However, a cathode 105 can be appropriately formed on a substrate 101. (At first, a cathode 105 can be formed on a substrate 101.)

In FIG. 2 and FIG. 3, a substrate 101 side is a display side. However, display is possible from a side opposite to a substrate 101 side.

The above-mentioned wet process includes an application method and a printing method. An application method includes a method using a spin coater, a bar coater, a roll coater, a die coater, a gravure coater. It is difficult to directly form a pattern by these application methods. On the other hand, a pattern can be directly formed by a printing method.

From here onwards, in the case where a film formation of a light emitting medium layer 103 is performed by a wet process, a printing method such as a relief printing method, a intaglio printing method, a screen printing method, a gravure printing method, a flexo printing method and an offset printing method can be preferably used.

A relief printing method is especially preferred for fabricating organic EL elements because such method makes it possible to perform printing without damaging the substrate in a good viscous characteristic of a coating liquid, and has a high utilization efficiency of a coating liquid material.

Figure 4:
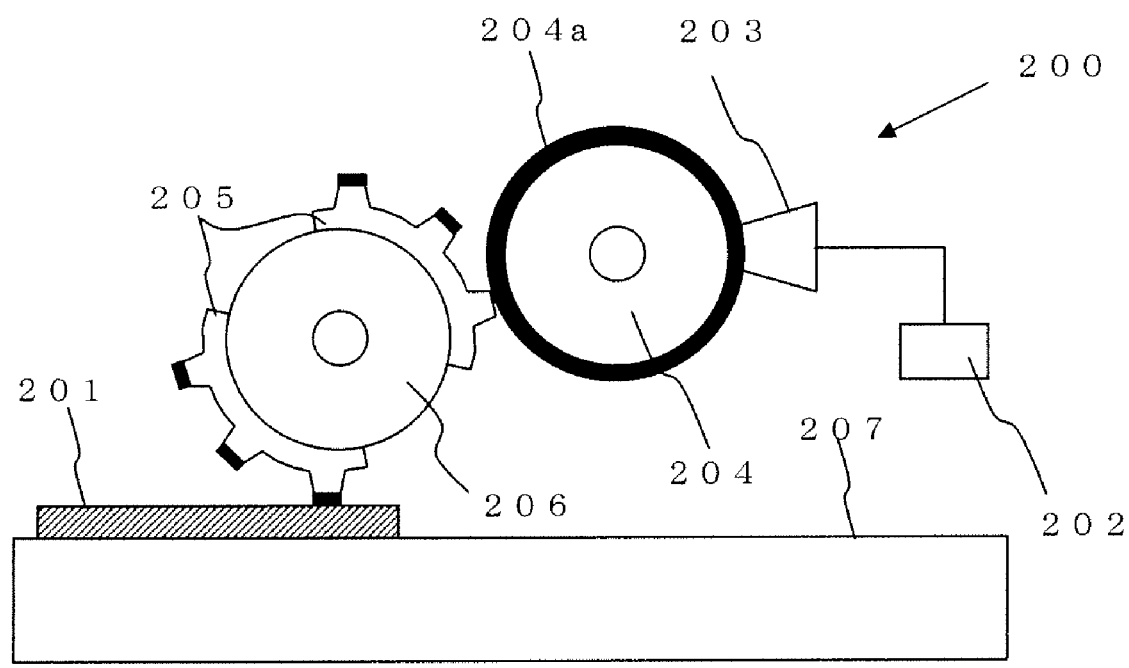
FIG. 4 is a schematic cross-sectional view showing an example of a relief printing apparatus used in an embodiment of the present invention.

FIG. 4 shows a schematic cross-sectional view of a relief printing apparatus 200 in which a pattern is formed on a substrate to be printed 201 with electrode by a printing method using a coating liquid including a material of a light emitting medium layer 103.

A relief printing apparatus 200 used for an embodiment of the present invention has an ink tank 202, an ink chamber 203, an anilox roll 204 and a plate cylinder 206 on which a plate 205 is mounted, the plate having a relief printing plate thereon. A coating liquid including a material of a light emitting medium layer 103 is taken in an ink tank 202. A coating liquid can be sent from an ink tank 203 to an ink chamber 203. An anilox roll is in contact with a coating liquid feeding part of an ink chamber 203 and is supported so that an anilox roll can be rotated.

According to the rotation of an anilox roll 204, a coating layer 204a including a coating liquid supplied on a surface of an anilox roll 204 becomes uniform. This coating layer 204a is transferred on relief parts (projection parts) of a plate 205 mounted on a plate cylinder 206 which is rotationally driven in proximity to an anilox roll 204.

A substrate 201 to be printed is transported to a printing position of a flat base 207 by a transporting means that are not illustrated. Further, an ink on relief parts of a plate 205 is printed on a substrate to be printed 201. Further, an ink is dried if necessary. A light emitting medium layer 103 is preferably formed on a substrate to be printed 201 in this way.

A light-sensitive resin relief printing plate is preferably used for plate 205 in which a relief printing plate is arranged.

As a light-sensitive resin relief printing plate, there is the following relief printing plate; a solvent developing type relief printing plate (developer for an exposed resin is an organic solvent); and a water-developable relief printing plate (developer is water). A solvent developing type relief printing plate has a resistance to a water type ink. A water-developable relief printing plate has a resistance to an organic solvent system ink. Depending on the characteristic of a coating liquid comprising a material of a light emitting medium layer 103, a relief printing plate can be preferably selected from a solvent developing type and a water developing type.

An organic El element 100 shown in FIG. 2 and FIG. 3 can be manufactured by the following processes: for example, a molybdenum oxide layer 104 is formed as a hole injection layer 103a under a vacuum condition; thereafter, interlayer layer 103b and an organic light emitting layer 103c are formed in an atmospheric air by a relief printing method using a relief printing apparatus 200; and, an electron injection layer 103d is formed under a vacuum condition.

Further, an organic EL element can be manufactured by both forming a light emitting medium layer 103 under a vacuum condition and forming a light emitting medium layer 103 in an atmospheric air. For example, a hole injection layer 103a is formed under a vacuum condition, an organic light emitting layer 103c is formed in an atmospheric air by a relief printing method, thereafter a molybdenum oxide layer 104 is formed as an electron injection layer 103d under a vacuum condition.

An organic EL element 100 of an embodiment of the present invention has a flat molybdenum oxide layer including a crystal structure. Therefore, resistivity or ionization potential can be optimized. Injection property or transport property of carrier is improved. An organic EL element 100 of a high light emitting efficiency, a high light emitting luminance and a long life time can be obtained.

Figure 5:
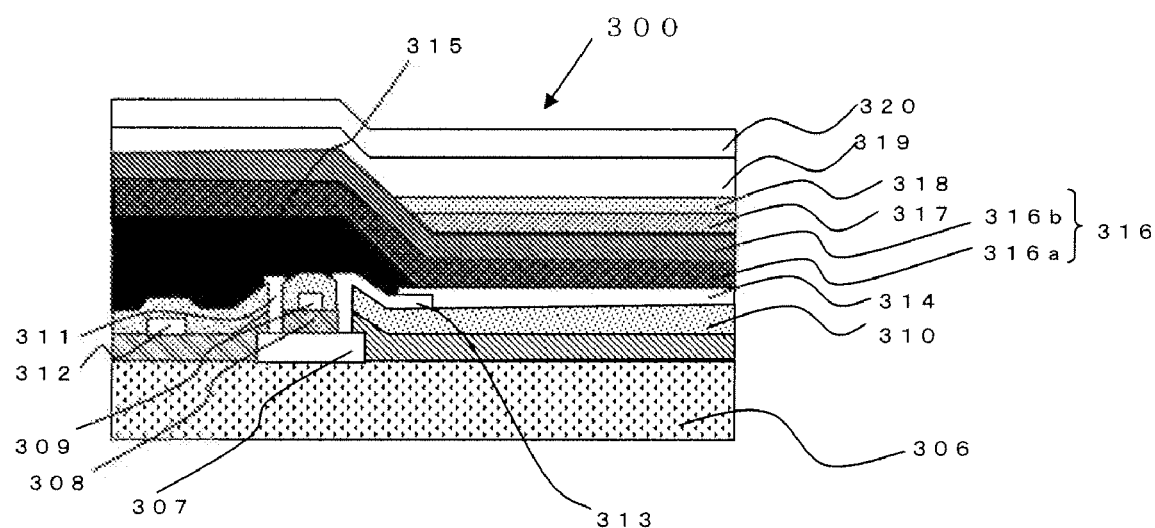
FIG. 5 is a schematic cross-sectional view showing an example of a display device with an organic EL element of an embodiment of the present invention.

As shown in FIG. 5, an organic EL display device 300 of an embodiment of the present invention includes a substrate 306, an active layer 307, a gate insulating film 308, a gate electrode 309, an interlayer insulating film 310, a drain electrode 311, a scanning line 312, a source electrode 313, a pixel electrode 314, a partition wall 315, a molybdenum oxide layer 316, a light emitting medium layer, a counter electrode 319 and an insulating protective layer 320. A molybdenum oxide layer 316 includes a crystal containing layer 316a and an amorphous layer 316b, a light emitting medium layer includes an interlayer layer 317 and an organic light emitting layer 318.

[Substrate 306]

A substrate (a back plane) 306 used for an organic EL display device 300 of an embodiment of the present invention includes a thin film transistor and an organic EL element 100.

A thin film transistor and an organic EL element formed above the thin film transistor are supported by a substrate 306. A substrate 306 may preferably be excellent in mechanical strength, insulating property and dimensional stability.

For example, the following materials can be used as a substrate 6:
1. glass, quartz, plastic film or sheet such as polypropylene, polyether sulfone, polycarbonate, cyclo olefin polymers, polyarylate, polyamide, polymethyl methacrylate, polyethylene terephthalate and polyethylenenaphthalate;
2. transparent substrate in which the plastic film or sheet is laminated by only monolayer or plural layers comprised of the following materials:

metallic oxide such as oxidation silicon and alumina;

metal fluoride such as aluminium fluoride and magnesium fluoride;

metal nitrides such as silicon nitride and aluminum nitride;

metal acid nitride such as oxynitriding silicon; and macromolecule resin film such as acrylic resin, epoxy resin, silicone oil and polyester resin;

3. metallic foil, sheet or board made of aluminium or stainless; and
4. non-transparent substrate in which a plastic film or sheet is laminated by a metal membrane such as aluminium, copper, nickel and stainless.

Depending on the direction which light comes out from an organic EL display device 300, the transparent property of a substrate 306 is selected.

It is necessary for a substrate 306 including the above-mentioned materials to avoid entry of moisture to an organic EL display device 300. For example, an inorganic film is formed on a substrate 306. Or fluorocarbon resin is applied to a substrate 306. It is desirable that exclusion of moisture and hydrophobic processing of a substrate 306 are preferably performed in this way. Particularly it is desirable to lower moisture content in a substrate 306 and gas transmission coefficient thereof to avoid entry of moisture to a light emitting media layer.

A thin film transistor provided on a substrate 306 has an active layer 307 where a drain electrode 311, a source electrode 313 and a channel area are formed, a gate insulating film 308 and a gate electrode 309. Configuration of a thin film transistor is, for example, staggered type, reverse staggered type, top gate type and coplanar type. However, configuration of a thin film transistor is not limited to these configurations.

An active layer 307 in an embodiment of the present invention can be formed by inorganic semiconductor materials such as amorphous silicon, polycrystalline silicon, crystallite silicon and cadmium selenide, or organic semiconductor materials such as thiophene oligomer, and poly (phenylene vinylene). However, a usable material is not limited to these.

A manufacturing method of an active layer 307 is exemplified below: a method performing ion doping after depositing amorphous silicon by a plasma CVD method; a method performing ion doping by an ion implantation method after forming poly silicon by crystallization of amorphous silicon by solid phase epitaxy after forming amorphous silicon by an LPCVD (low pressure CVD) method using $SiH_4$ gas; a method performing ion doping by an ion doping method after forming poly silicon by annealing amorphous silicon using a laser such as excimer laser and crystallization of amorphous silicon after forming amorphous silicon by an LPCVD method using $Si_2H_6$ gas or a PECVD (plasma enhanced CVD) method using $SiH_4$ gas (low temperature process); and a method performing ion doping by an ion implantation method after forming a gate electrode 309 of $n^+$ poly silicon on a gate insulating film after forming a gate insulating film by thermal oxidation at a temperature of 1,000 degrees Celsius or more after depositing poly silicon by LPCVD or PECVD (high temperature process).

A gate insulating film 308 in an embodiment of the present invention is as follows: $SiO_2$ formed by a PECVD method or an LPCVD method; and $SiO_2$ obtained by thermal oxidation of a poly silicon film. However, usable materials are not limited to these.

A gate electrode 309 in an embodiment of the present invention is as follows: Metal such as aluminum and copper, refractory metal such as titanium, tantalum and tungsten, poly silicon, silicide of refractory metal, or polycide. However, usable materials are not limited to these.

For a thin film transistor in an embodiment of the present invention, a single gate structure, a double gate structure, multiple gating configuration having three or more gate electrodes are exemplified. In addition, even LDD configuration and offset configuration are preferable. Even more particularly, two or more thin film transistors may be placed on one pixel.

It is necessary for the thin film transistor to be connected so that thin film transistor functions as a switching element of an organic EL display device 300. A drain electrode 311 or a source electrode 314 of the thin film transistor is electrically connected with pixel electrodes 314 of an organic EL display device 300.

In an embodiment of the present invention, an active matrix drive type organic EL display device 300 is explained. However, the present invention can be applied to a passive matrix drive type organic EL display device.

[Pixel Electrode 314]

As shown in FIG. 5, a pixel electrode 314 in an embodiment of the present invention is electrically connected to a source electrode 313 of a thin film transistor on a substrate 306 and is formed by patterning if necessary. A pixel electrode 314 is sectioned by a partition wall 315. The sectioned pixel electrode 314 corresponds to respective pixels. Here, a pixel electrode 314 of a passive matrix drive type organic EL display device is formed on a substrate 306 and patterning of a pixel electrode 314 can be performed if necessary.

Materials of a pixel electrode 314 are described below: metal complex oxide such as ITO (indium tin complex oxide), indium zinc complex oxide or zinc aluminium complex oxide; metallic substances such as gold, platinum and chromium; and the particle dispersion membrane in which finely divided particles of the metallic oxide or the metallic substance are dispersed in epoxy resin or acrylic resin. A single-layered body or a laminated material of the above described material can be used. However, materials of pixel electrode 314 are not limited to these.

When a pixel electrode 314 is an anode, it is desirable to select the material such as ITO which has a high work function. In the case of a so-called bottom emission configuration in which light is taken out from a lower side, it is necessary to select a material with translucency as a material of a pixel electrode 314. Metallic substances such as copper or aluminum may be added as a supporting electrode to make an electric wiring electrical resistance of a pixel electrode 13 small if necessary. Here, in the case of a so-called top emission configuration in which light is taken out from a upper side (an opposite side of the substrate 306 side), a counter electrode 319 can be formed on the substrate at first.

For a formation method of a pixel electrode 314, the following methods can be used depending on the material: dry methods such as resistance heating evaporation method, electron-beam evaporation technique, a reactivity evaporation method, an ion plating method and a sputtering method; and wet methods such as a gravure process and screen printing.

For a patterning method of a pixel electrode 314, depending on a material and a film formation method, existing patterning methods such as a mask evaporation method, a photolithography method, a wet etching method and a dry etching method can be used. In a case where a product with a thin film transistor is used as a substrate, the product with a thin film transistor should be formed so that a pixel electrode is electrically connected to a corresponding pixel in a lower layer.

[Partition Wall 315]

A partition wall 315 can be formed so as to section a light emitting area corresponding to a pixel. It is desirable that the partition wall be formed so as to cover an edge of pixel electrode 13. (See FIG. 5) In an active matrix drive-type organic EL display device 300, a pixel electrode 314 is formed for every pixel and the respective pixels tend to occupy as large an area as possible. Therefore, the most preferable shape of a partition wall 315 to be formed so as to cover an edge of a pixel electrode is basically a grid shape.

For a formation method of a partition wall 315, the following method can be used: 1). An inorganic film is uniformly formed on a substrate (with a pixel electrode), this substrate is masked with a resist, and dry etching of an inorganic film is performed; or 2). A photosensitive resin is laminated on a substrate, and a predetermined pattern is formed by a photolithography method. Water-repellent may be added if necessary. By means of irradiating plasma or UV on a partition wall after the formation of a partition wall, a partition wall can be ink repellent.

Height of a partition wall 315 is preferably 0.1 μm-10 μm, more preferably 0.5 μm-2 μm. If a partition wall is higher than 10 μm, a partition wall may prevent a counter electrode 2 from forming and prevent sealing. If a partition wall is lower than 0.1 μm, a partition wall can not perfectly cover an edge of a pixel electrode 314, or color mixture or short circuit between adjacent pixels occurs when a light emitting medium layer is formed.

[Light Emitting Medium Layer]

A light emitting medium layer in an embodiment of the present invention includes a molybdenum oxide layer 316, an interlayer layer 317 and an organic light emitting layer 318. In addition, as a functional layer of a light emitting medium layer, (not illustrated) a hole transport layer, a hole injection layer, an electron transport layer, an electron injection layer and the like can be preferably used besides a molybdenum oxide layer 316 and an interlayer layer 317.

After a partition wall is formed, a hole transport layer can be formed on a pixel electrode 314. Examples of a hole transport material is as follows: a poly aniline derivative, poly thiophenes, a polyvinylcarbazole (PVK) derivative and poly (3,4-ethylenedioxy thiophene) (PEDOT). However, usable materials are not limited to these. A hole transport layer is formed by dissolving or dispersing these materials in a solvent and applying it by various application methods using a spin coater etc. or a relief printing method.

Examples of an inorganic material are as follows:

alkali metal such as Li, Na, K, Rb, Ce and Fr;

alkaline earth metallic elements such as Mg, Ca, Sr and Ba;

lanthanoid system element such as La, Ce, Sm, Eu, Gd and Yb;

metallic elements such as Au, Cu, Al, Fe, Ni, Ru, Sn, Pb, Cr, Ir, Nb, Pt, W, Mo, Ta, Pa and Co;

Si and Ge; and compounds such as oxide, carbides, nitride and boride of the above materials.

The inorganic material is deposited by an evaporation method, a sputtering method or a CVD method.

In FIG. 5, a molybdenum oxide layer 316 is formed as a hole transport layer. However, a molybdenum oxide layer 316 is formed as an arbitrary layer. Further, a plurality of molybdenum oxide layers 316 can be used as a functional layer.

A molybdenum oxide layer 316 can be formed as follows:

A vacuum evaporation of a molybdenum oxide powder is performed by a resistance heating or an electron beam;

a film is formed in the above vacuum evaporation while $O_2$ gas is further introduced; or a reactive sputtering method using both Ar gas and $O_2$ gas.

In the above respective methods, the following processes are further performed:

A film is formed while a substrate is heated (a heating film formation); or after a film is formed, heating is performed.

Thereby, a molybdenum oxide layer 316 including a crystal can be manufactured.

Degree or percentage of crystal changes according to a heating temperature. In the case of a heating film formation, if a temperature is equal to or more than 60 degrees Celsius, manufacturing is possible. In the case where a film is heated after a film is formed, if a temperature is equal to or more than 180 degrees Celsius, manufacturing is possible.

In the case where a reactive sputtering method is especially used as a manufacturing method, a fact that crystallinity or film quality changes according to a temperature of a substrate is known as a fine model of a thin film by Thornton. Solid state properties can be changed according to a purpose. (In detail, see J. A. Thornton: J.Vac. Sci. T., 11, 666 (1974).)

An arbitrary amount of oxygen is used. In the case of a reactive sputtering method using a molybdenum metal target, the composition ratio can be changed by changing an oxide pressure in a total gas pressure. In the case where a concentration of oxygen is 10% or more, a molybdenum oxide layer 316 can be formed. In this case, a condition changes according to an apparatus.

In addition, it is preferable that a total gas pressure is 0.1 Pa-2.0 Pa, in view of a threshold value of ignition of plasma.

On the other hand, an amorphous layer 316b can be usually manufactured by forming a film at a room temperature in which a substrate is not heated.

By using these, as shown in FIG. 5, a crystal containing layer 316a is formed while a substrate is heated. After a temperature of a substrate is lowered to a room temperature, an amorphous layer 316b is formed, thereby a molybdenum oxide layer 316 can be formed.

A composition ratio of oxygen to molybdenum can be confirmed by a composition analysis such as X-ray Photoelectron Spectroscopy (XPS). Crystallization can be confirmed by X-ray diffraction (XRD).

After a molybdenum oxide layer 316 is formed, an interlayer layer 317 can be formed. Examples of materials used for an interlayer layer 317 in an embodiment of the present invention include polyvinylcarbazole, derivative of polyvinylcarbazole, polyarylene derivative having aromatic amine at a main chain or a side chain, and polymers having aromatic amine such as aryl amine derivative and triphenyl diamine derivative. However, usable materials are not limited to these. These materials are dissolved or dispersed in a solvent, and an interlayer layer 317 is formed by using the dissolved or dispersed material by various application methods using a spin coater etc. or a relief printing method. In addition, in the case where an inorganic material is used for a material of an interlayer layer 317, an interlayer layer 317 can be formed by using a metal oxide by a vacuum vapor deposition method, a sputtering method or a CVD method.

After an interlayer layer 317 is formed, an organic light emitting layer 318 can be formed. An organic light emitting layer 318 is a layer emitting light by an electric current. Examples of organic light emitting materials forming organic light emitting layers 318 include the materials which are light emitting pigments such as a coumarin system, a perylene system, a pyran system, an anthrone system, a porphyrin system, a quinacridon system, an N,N'-dialkyl permutation quinacridon system, a naphthalimido system, N,N'-diaryl permutation pyrrolo pyrrole series and an iridium complex system. These materials can be scattered in macromolecules such as polystyrene, polymethyl methacrylate and polyvinyl carbazole. In addition, high polymer materials such as poly arylene system, PAV [polyarylenevinylene] system, a poly fluorene system or a polyphenylene vinylene system can be used. However, usable organic light emitting materials are not limited to these.

An organic light emitting ink is prepared by dissolving or stably dispersing the organic light emitting material in a solvent. For a solvent dissolving or dispersing an organic light emitting material, toluene, xylene, acetone, anisole, methyl ethyl ketone, methyl isobutyl ketone and cyclohexanone can be used. The above-mentioned solvent may be used alone. In addition, the above mentioned solvent may be used as a mixed solvent. Above all, an aromatic organic solvent such as toluene, xylene and anisole is preferred from the aspect of solubility of an organic light emitting material. In addition, a surface active agent, an antioxidant, a viscosity modifier and an ultraviolet absorber may be added to an organic light emitting ink if necessary.

As shown in FIG. 5, an active matrix drive type display device using an organic EL element 100 can be manufactured as follows: a molybdenum oxide layer 316 is formed as a hole transport layer under a vacuum condition. Thereafter, interlayer layer 317 and an organic light emitting layer 318 can be formed by a relief printing method in atmospheric air.

[Counter Electrode 319]

As shown in FIG. 5, in the case where a counter electrode 319 in an embodiment of the present invention is used as a cathode, a substance which has a high electron injection efficiency to an organic light emitting layer 318 and a low work function can be used.

In some embodiments, counter electrode 319 can include a metal such as Mg, Al, Yb. In addition, the following layer stack may be put in a boundary surface of a light emitting medium layer. The layer stack is a stack with a chemical compound of about 1 nm thicknesses such as Li and oxidation Li and LiF, and Al and Cu having stability and high conductivity. Stability should be balanced with electron injection efficiency. Therefore an alloy system may be used. An alloy of one or more kinds of metal such as Li, Mg, Ca, Sr, La, Ce, Er, Eu, Sc, Y, and Yb that have a low work function, and a metallic element such as Ag, Al, and Cu which are stable can be used. However, usable materials are not limited to these. In some embodiments, alloys such as MgAg, AlLi, and CuLi can be used. In the case of a so-called top emission structure in which light is taken from an upper side, a translucent material should be selected for a counter electrode 319. A metal complex oxide such as ITO which is used for a pixel electrode 314 can be used as a counter electrode 319. In the case where ITO is used as a counter electrode 319, a compound such as Li, oxidation Li and LiF can be used between a counter electrode 319 and a light emitting medium layer.

For the method for forming counter electrode 319, depending on the material, a resistance heating evaporation coating method, an electron beam-evaporation coating method, a reactive deposition method, an ion plating method, or a sputtering method can be used.

[Insulating Protective Layer 320]

An insulating protective layer 320 is formed so as to prevent a gas such as outside oxygen or moisture from coming in through an interface between a sealing material and an organic EL element in the case where a sealing material is formed. Examples of a material of an insulating protective layer 320 include an inorganic compound such as oxide, nitride, oxynitride, sulfide, carbonide and fluoride including one atom or two or more atoms selected from a group consisting of Li, Na, K, Rb, Cs, Cu, Mg, Ba, Ca, Sr, Zn, Cd, Al, Ga, In, Sc, Y, Si, Ge, Ti, Zr, Hf, Sb, Nb, Ta, Se, Cr, W, Fe, Co, Yb, Eu, Ce, La, Rb, Lu, Ho, Er, Sm and Tm. Further, it is preferable that carbon be used as a constitution material of an insulating protective layer 320. In this case, the material is an organic material.

An inorganic compound for forming an insulating protective layer 320 is as follows:

metal oxide or metal nitride such as LiOx, LiNx, NaOx, KOx, RbOx, CsOx, BeOx, MgOx, MgNx, CaOx, CaNx, SrOx, BaOx, ScOx, YOx, YNx, LaOx, LaNx, CeOx, PrOx, NdOx, SmOx, EuOx, GdOx, TbOx, DyOx, HoOx, ErOx, TmOx, YbOx, LuOx, TiOx, TiNx, ZrOx, ZrNx, HfOx, HfNx, ThOx, VOx, VNx, NbOx, NbNx, TaOx, TaNx, CrO, MnOx, ReOx, FeOx, FeNx, RuOx, OsOx, CoOx, RhOx, IrOx, NiOx, PdOx, PtOx, CuOx, CuNx, AgOx, AuOx, ZnOx, CdOx, HgOx, BOx, BNx, AlOx, AlNx, GaOx, GaNx, InOx, SiNx, GeOx, SnOx, PbOx, POx, PNx, AsOx, SbOx, SeOx and TeO(x=½–2);

metal complex oxide such as $LiAlO_2$, $Li_2SiO_3$, $Li_2TiO_3$, $Na_2Al_2O_3$, $NaFeO_2$, $Na_4SiO_4$, $K_2SiO_3$, $K_2TiO_3$, $K_2WO_4$, $Rb_2CrO_4$, $Cs_2CrO_4$, $MgAl_2O_4$, $MgFe_2O_4$, $MgTiO_3$, $CaTiO_3$, $CaWO_4$, $CaZrO_3$, $SrFe_{12}O_{19}$, $SrTiO_3$, $SrZrO_3$, $BaAl_2O_4$, $BaFe_{12}O_{19}$, $BaTiO_3$, $Y_3A_{15}O_{12}$, $Y_3Fe_5O_{12}$, $LaFeO_3$, $La_3Fe_5O_{12}$, $La_2Ti_2O_7$, $CeSnO_4$, $CeTiO_4$, $Sm_3Fe_5O_2$, $EuFeO_3$, $Eu_3Fe_5O_{12}$, $GdFeO_3$, $Gd_3Fe_5O_{12}$, $DyFeO_3$, $Dy_3Fe_5O_{12}$, $HoFeO_3$, $Ho_3Fe_5O_2$, $ErFeO_3$, $Er_3Fe_5O_{12}$, $Tm_3Fe_5O_{12}$, $LuFeO_3$, $Lu_3Fe_5O_{12}$, $NiTiO_3$, $Al_2TiO_3$, $FeTiO_3$, $BaZrO_3$, $LiZrO_3$, $MgZrO_3$, $HfTiO_4$, $NH_4VO_3$, $AgVO_3$, $LiVO_3$, $BaNb_2O_6$, $NaNbO_3$, $SrNb_2O_6$, $KTaO_3$, $NaTaO_3$, $SrTa_2O_6$, $CuCr_2O_4$, $Ag_2CrO_4$, $BaCrO_4$, $K_2MoO_4$, $Na_2MoO_4$, $NiMoO_4$, $BaWO_4$, $Na_2WO_4$, $SrWO_4$, $MnCr_2O_4$, $MnFe_2O_4$, $MnTiO_3$, $MnWO_4$, $CoFe_2O_4$, $ZnFe_2O_4$, $FeWO_4$, $CoMoO_4$, $CoTiO_3$, $CoWO_4$, $NiFe_2O_4$, $NiWO_4$, $CuFe_2O_4$, $CuMoO_4$, $CuTiO_3$, $CuWO_4$, $Ag_2MoO_4$, $Ag_2WO_4$, $ZnAl_2O_4$, $ZnMoO_4$, $ZnWO_4$, $CdSnO_3$, $CdTiO_3$, $CdMoO_4$, $CdWO_4$, $NaAlO_2$, $MgAl_2O_4$, $SrAl_2O_4$, $Gd_3Ga_5O_{12}$, $InFeO_3$, $MgIn_2O_4$, $Al_2TiO_5$, $FeTiO_3$, $MgTiO_3$, $Na_2SiO_3$, $CaSiO_3$, $ZrSiO_4$, $K_2GeO_3$, $Li_2GeO_3$, $Na_2GeO_3$, $Bi_2Sn_3O_9$, $MgSnO_3$, $SrSnO_3$, $PbSiO_3$, $PbMoO_4$, $PbTiO_3$, $SnO_2$—$Sb_2O_3$, $CuSeO_4$, $Na_2SeO_3$, $ZnSeO_3$, $K_2TeO_3$, $K_2TeO_4$, $Na_2TeO_3$ and $Na_2TeO_4$;

sulfide such as FeS, $Al_2S_3$, MgS and ZnS;

fluoride such as LiF, $MgF_2$ and $SmF_3$;

chloride such as HgCl, $FeCl_2$ and $CrCl_3$;

bromide such as AgBr, CuBr and $MnBr_2$;

iodide such as $PbI_2$, CuI and $FeI_2$; and metal oxide such as SiAlON.

However, usable materials are not limited to these.

It is preferable that oxide, nitride, oxynitride, sulfide, carbonide or fluoride including one or more metal atoms selected from a group consisting of Ca, Al, Si, Ge and Ce be used. This is because a denser insulating protective layer 320 can be obtained. In addition, since a driving voltage does not increase excessively, CaS, $Al_2O_3$, AlN, $SiO_2$, SiC, $GeO_2$ and $CeO_2$ are more preferable. In view of performance and easily handling, $SiO_2$ is most preferable material. However, in the case where oxide of Si is used as a constitution material of a surface insulating protective layer 320, oxide of Si is not limited to $SiO_2$. SiOx (x:1<x≦2) can be used.

A film forming method of an insulating protective layer 320 is selected from a film forming method such as a resistance heating method, an electron beam evaporation method, a sputtering method, an ion plating method and a CVD method, in view of a melting point, a boiling point and a vapor pressure of a material.

[Sealing Body (Not Illustrated)]

A sealing body including a sealing medium and a resin layer can be usually provided so that an organic EL element is shielded from outside for the purpose that an atmospheric gas does not reach an organic EL element.

For a sealing medium, it is necessary for the permeability of moisture and oxygen to be low. In addition, as an example of a material for a sealing medium, ceramics such as alumina, silicon nitride and boron nitride, glass such as no-alkali glass and alkali glass, quartz, and humidity resistance film are exemplified. For example, the following humidity resistance film is exemplified: a film in which SiOx is formed by a CVD method on both sides thereof; a film in which a film having a low permeability of moisture and oxygen and a hydrophilic film are laminated; and a film in which a water absorption agent is applied thereon, the film having a low permeability of moisture and oxygen. It is preferable for water vapor permeation rate of the humidity resistance film to be equal to or less than $10^{-6}$ g/m$^2$/day.

For example, for a resin layer, the following materials can be used: a photo-curing adhesive property resin, a heat curing adhesive property resin and two fluid hardening adhesive property resins including an epoxy type resin, acrylic resin, silicone oil or the like, acrylic resin such as ethylene ethylacrylate (EEA) polymer, vinyl resins such as ethylene vinyl acetate (EVA), thermoplastic resin such as polyamide, synthetic rubber, and thermoplasticity adhesive property resins such as acid denatured substances of polyethylen or polypropylene.

An example of a method for forming a resin layer on a sealing medium is shown below: a solvent solution method, a pushing out laminate method, a fusion/hot melt method, a calender method, a discharge jet application method, screen printing, a vacuum laminate method and a heated roll laminate method. A material having hygroscopicity and a property to absorb oxygen can be incorporated into a resin layer if necessary. The thickness of a resin layer formed on a sealing medium is decided by the size and configuration of a sealed organic EL element. About 5-500 μm is desirable for the thickness of a resin layer. In addition, here, a resin layer is formed on a sealing medium. However, a resin layer can be directly formed on an organic EL element side.

Finally, in a sealing room, an organic EL display element is affixed to a sealing body. When it is a two layer construction including a sealing medium and a resin layer of thermoplastic resin, contact bonding is preferably performed only by a heating roller.

In the case of a heat curing type adhesion resin, it is desirable that a heat curing type adhesion resin be heated and hardened at a curing temperature after the resin is attached by pressure using a heating roller. In the case of a photo-curing-related adhesion resin, it is sealed by pressure using a roller. Thereafter, a photo-curing-related adhesion resin can be cured by irradiating light.

An organic EL display device 300 of an embodiment of the present invention includes a crystal structure and a flat molybdenum oxide layer. Therefore, resistivity and IP (ionization potential) can be optimized. Injection property or transport property of carrier can be improved. Thereby, an organic EL display device 300 having a high light emitting efficiency, a high light emitting luminance and a long life time can be obtained.

According to the present invention, an organic electroluminescence element and a method for manufacturing the element and an organic electroluminescence display device can be obtained. In the present invention, the element includes a crystal structure and a flat molybdenum layer. Therefore, resistivity and IP (ionization potential) can be optimized. Injection property or transport property of carrier can be improved. Thereby, an organic EL display device having a high light emitting efficiency, a high light emitting luminance and a long life time can be obtained.

EXAMPLE 1

As shown in FIG. 5, an active matrix substrate 306 with a thickness of 0.7 mm was used. The active matrix substrate 306 had a thin film transistor formed on a substrate 306, the transistor functioning as a switching element, and a pixel electrode 314 electrically connected to a source electrode 313, the pixel electrode 314 formed above the thin film transistor. As for a substrate 306, the diagonal size was 5 inches and the number of pixels was 320×240.

A partition wall 315 was formed so that its shape allowed it to cover an end of the pixel electrode 314 provided on this substrate 306 and to section pixels. The partition wall 315 was formed by the following processes: a positive resist (ZWD6216-6: a product of ZEON CORPORATION) was formed on the entire surface of the substrate 306 by a spin coater so that the thickness of the resist was 2 μm; and the partition wall having a width of 40 μm was formed by patterning using a photolithography method. In this way, the pixel region was sectioned so that the number of sub pixel was 960×240 dot and the pitch was 0.12 mm×0.36 mm.

Next, a crystal containing layer 316a of molybdenum oxide with a thickness of 100 nm as a hole transport layer was formed on a pixel electrode 314. In this case, a pattern was formed by both a reactive sputter method and a shadow mask method while a substrate 306 was heated so that a temperature of a substrate was 70 degrees Celsius. Next, a substrate on which a hole transport layer was formed was arranged on a substrate to be printed 201 placed on a relief printing apparatus 200. An interlayer layer 317 was formed by a relief printing method so that an interlayer layer 317 was located directly above a pixel electrode 314 between partition walls 315 wherein an interlayer layer 317 corresponded to a line pattern of a pixel electrode 314. Printing was performed using an ink including polyvinylcarbazole derivative dissolved in toluene, in which concentration of polyvinylcarbazole derivative was 0.5%. Here, polyvinylcarbazole derivative is a material of an interlayer layer 317. In this printing, an anilox roll 204 of 300 lines/inch and a water developable type photosensitive resin plate 205 were used. After printing and drying of an interlayer layer 317, a film thickness thereof was 20 nm.

Next, a substrate on which an interlayer layer was formed was arranged on a substrate to be printed 201 placed on a relief printing apparatus 200. An organic light emitting layer 318 was formed by a relief printing method so that an organic light emitting layer 318 was located directly above a pixel electrode 314 between partition walls wherein an organic light emitting layer 318 corresponded to a line pattern of a pixel electrode 314. Printing was performed using an organic light emitting ink including polyphenylene vinylene derivative dissolved in toluene, in which concentration of polyphenylene vinylene derivative was 1%. Here, polyphenylene vinylene derivative is a material of an organic light emitting layer 318. In this printing, an anilox roll 204 of 150 lines/inch and a water developable type photosensitive resin plate 205 were used. After printing and drying of an organic light emitting layer 318, a film thickness thereof was 80 nm.

Next, as a counter electrode 319, a barium film was deposited to 10 nm thickness by a vacuum evaporation method using a metal mask. Next, an aluminum film was deposited to 150 nm thickness using a metal mask.

Next, an insulating protective layer 320, SiOx was deposited to 5 nm by a vacuum evaporation method using the same metal mask.

Next, a glass plate of 0.3 mm thickness with a resin layer was prepared wherein the resin layer was applied to the entire surface of the glass plate. As for the size of the glass plate, the glass plate could cover the entire surface of the substrate on which an organic EL element was formed. The glass plate with the resin layer was arranged on the substrate, and the resin layer was hardened by heating it for 1 hour at 90 degrees Celsius. Thereby, sealing was performed. As for the manufactured active matrix drive type organic EL display device 300, the total thickness was 1.0 mm.

The obtained active matrix drive type organic EL display device 300 was driven. At initial time, there was not uneven luminance and a nonlighting area, and a light emitting is even and excellent. In addition, luminance was 8000 cd/m$^2$ at 7 V, and half life of luminance in the case of initial luminance of 8000 cd/m$^2$ was 1000 hrs. That is, the display characteristic was excellent (a high light emitting efficiency, a high light emitting luminance and a long life time). In addition, the current value rapidly increased at 1600 hrs.

EXAMPLE 2

A sample was manufactured by the same way as Example 1, thereby sample with a pixel electrode 314 was prepared. Next, as a hole a transport layer, a pattern of a crystal containing layer 316a of molybdenum oxide of 100 nm thickness was formed by both a reactive sputtering method and a shadow mask method while a substrate 6 was heated to 150 degrees Celsius. The sample was manufactured by the same way as Example 1 except for the above. The obtained active matrix drive type organic EL display device 300 was driven. At initial time, there was not uneven luminance and a nonlighting area, and a light emitting is even and excellent. In addition, luminance was 8000 cd/m$^2$ at 6 V, and half life of luminance in the case of initial luminance of 8000 cd/M$^2$ was 1200 hrs. That is, the display characteristic was excellent (a high light emitting efficiency, a high light emitting luminance and a long life time). In addition, the current value rapidly increased at 1400 hrs.

EXAMPLE 3

A sample was manufactured by the same way as Example 1, thereby a sample with a pixel electrode 314 was prepared. Next, as a hole transport layer, a pattern of a crystal containing layer 316a of molybdenum oxide of 80 nm thickness was formed by both a reactive sputtering method and a shadow mask method while a substrate 6 was heated to 300 degrees Celsius. In a condition where a substrate 6 is cooled to a room temperature, a pattern of an amorphous layer 316b of 20 nm thickness was formed by a reactive sputtering method and a shadow method. The sample was prepared by the same way as Example 1 except for the above.

The obtained active matrix drive type organic EL display device 300 was driven. At initial time, there was not uneven luminance and a nonlighting area, and a light emitting is even and excellent. In addition, luminance was 8000 cd/m$^2$ at 8 V, and half life of luminance in the case of initial luminance of 8000 cd/m$^2$ was 1500 hrs. That is, the display characteristic was excellent (a high light emitting efficiency, a high light emitting luminance and a long life time). In addition, a rapid increase of the current value was not observed at 2000 hrs.

COMPARATIVE EXAMPLE 1

A sample was manufactured by the same way as Example 1, thereby a sample with a pixel electrode 314 was prepared. Next, as a hole transport layer, a pattern of an amorphous layer 316b of molybdenum oxide of 100 nm thickness was formed by both a reactive sputtering method and a shadow mask method while a substrate 6 was not heated. The sample was manufactured by the same way as Example 1 except for the above.

The obtained active matrix drive type organic EL display device 300 was driven. At initial time, there was not uneven luminance and a nonlighting area, and a light emitting is even and excellent. In addition, luminance was 8000 cd/m$^2$ at 10 V, and half life of luminance in the case of initial luminance of 8000 cd/m$^2$ was 500 hrs. The above display characteristic (a light emitting efficiency, a light emitting luminance and a life time) was obtained. In addition, a rapid increase of the current value was not observed at 2000 hrs. Example 1, Example 2 and Comparative Example 1 are compared with each other. In Example 1 and Example 2, molybdenum oxide layer 104 including a crystal containing layer 104a was formed between a pixel layer 314 and an interlayer layer 317. Therefore, the resistivity and IP (ionization potential) are optimized. The injection property or transport property of the carrier was improved. Excellent display characteristics of a high light emitting efficiency, a high light emitting luminance and a long life time was obtained.

What is claimed is:

1. An organic electroluminescence element comprising:
   an anode which is a hole injection electrode;
   a cathode which is an electron injection electrode, the cathode facing the anode;
   an organic light emitting layer between the anode and the cathode, the organic light emitting layer including a molybdenum oxide layer, the molybdenum oxide layer including a crystal molybdenum oxide and an amorphous molybdenum oxide, and the crystal molybdenum oxide and the amorphous molybdenum oxide being mixed or stacked.

2. The organic electroluminescence element according to claim 1, wherein a film thickness of the molybdenum oxide layer is equal to or more than 30 nm and equal to or less than 150 nm.

3. The organic electroluminescence element according to claim 1, wherein the molybdenum oxide layer includes a crystal containing layer which contains the crystal molybdenum oxide and an amorphous layer which does not contain the crystal molybdenum oxide, and
   wherein the crystal containing layer is between the anode and the amorphous layer.

4. The organic electroluminescence element according to claim 3, wherein a film thickness of the crystal containing layer is equal to or more than 2 nm and equal to or less than 100 nm.

5. The organic electroluminescence element according to claim 3, wherein a film thickness of the amorphous layer is equal to or more than 5 nm and equal to or less than 50 nm.

6. An organic electroluminescence display device, comprising:
   the organic electroluminescence element according to claim 1 as a display element.

7. A method for manufacturing an organic electroluminescence element, the method comprising:
   forming an anode which is a hole injection electrode;
   forming a molybdenum oxide layer on the anode by a physical vapor deposition, the molybdenum oxide layer including a crystal molybdenum oxide and an amorphous molybdenum oxide, the crystal molybdenum oxide and the amorphous molybdenum oxide being mixed or stacked;
   forming an organic light emitting layer on the molybdenum oxide layer; and forming a cathode on the organic light emitting layer, the cathode being an electron injection electrode.

8. The method for manufacturing an organic electroluminescence element according to claim 7,
wherein a film thickness of the molybdenum oxide layer is equal to or more than 30 nm and equal to or less than 150 nm.

9. The method for manufacturing an organic electroluminescence element according to claim 7,
wherein the molybdenum oxide layer is formed by a physical vapor deposition while heating is performed, and
wherein the crystal molybdenum oxide and the amorphous molybdenum oxide are mixed.

10. The method for manufacturing an organic electroluminescence element according to claim 9,
wherein the heating temperature is equal to or more than 60 degrees Celsius and less than 300 degrees Celsius.

11. The method for manufacturing an organic electroluminescence element according to claim 7,
wherein the molybdenum oxide layer includes a crystal containing layer which contains the crystal molybdenum oxide and an amorphous layer which does not contain the crystal molybdenum oxide, and
wherein the crystal containing layer is between the anode and the amorphous layer.

12. The method for manufacturing an organic electroluminescence element according to claim 11,
wherein the crystal containing layer is formed by a physical vapor deposition while heating is performed.

13. The method for manufacturing an organic electroluminescence element according to claim 11,
wherein the amorphous layer is formed by a physical vapor deposition while heating is not performed.

14. The method for manufacturing an organic electroluminescence element according to claim 11,
wherein the crystal containing layer is formed while heating is performed in which a heating temperature is equal to or more than 300 degrees Celsius, and
wherein the amorphous layer is formed in which a heating temperature is less than 60 degrees Celsius.

15. The method for manufacturing an organic electroluminescence element according to claim 11,
wherein a film thickness of the crystal containing layer is equal to or more than 2 nm and equal to or less than 100 nm.

16. The method for manufacturing an organic electroluminescence element according to claim 11,
wherein a film thickness of the amorphous layer is equal to or more than 5 nm and equal to or less than 50 nm.

* * * * *